United States Patent
Sekiya et al.

(10) Patent No.: US 10,312,099 B2
(45) Date of Patent: Jun. 4, 2019

(54) WAFER PROCESSING METHOD

(71) Applicant: DISCO CORPORATION, Tokyo (JP)

(72) Inventors: Kazuma Sekiya, Tokyo (JP); Karl Heinz Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/964,396

(22) Filed: Apr. 27, 2018

(65) Prior Publication Data

US 2018/0315610 A1   Nov. 1, 2018

(30) Foreign Application Priority Data

Apr. 28, 2017 (JP) .................................. 2017-090060

(51) Int. Cl.
| | |
|---|---|
| *H01L 21/56* | (2006.01) |
| *H01L 21/78* | (2006.01) |
| *H01L 21/304* | (2006.01) |
| *H01L 21/683* | (2006.01) |

(52) U.S. Cl.
CPC ............ *H01L 21/304* (2013.01); *H01L 21/56* (2013.01); *H01L 21/6836* (2013.01); *H01L 21/78* (2013.01)

(58) Field of Classification Search
None
See application file for complete search history.

(56) References Cited

U.S. PATENT DOCUMENTS

2012/0080138 A1\*   4/2012   Yew ...................... B24B 7/228
156/153

FOREIGN PATENT DOCUMENTS

JP          10050642          2/1998

\* cited by examiner

*Primary Examiner* — Thien F Tran
(74) *Attorney, Agent, or Firm* — Greer Burns & Crain, Ltd.

(57) ABSTRACT

A wafer processing method includes a protective film providing step of providing a protective film on the front side of a wafer, a wafer unit forming step of applying a liquid resin curable by an external stimulus to the front side of the wafer and then curing the liquid resin by applying the external stimulus to form a protective member, thereby forming a wafer unit composed of the wafer, the protective film, and the protective member in the condition where the front side of the wafer is covered with the protective member, a grinding step of holding the protective member on a holding surface of a chuck table and then grinding the back side of the wafer of the wafer unit to thereby reduce the thickness of the wafer, and a peeling step of peeling the protective member and the protective film from the wafer reduced in thickness.

8 Claims, 7 Drawing Sheets

WAFER PROCESSING METHOD

BACKGROUND OF THE INVENTION

Field of the Invention

The present invention relates to a wafer processing method for use in grinding a wafer having unevenness on the front side thereof.

Description of the Related Art

There are increased cases that a wafer is processed to be thinned before it is divided into device chips, in order to reduce the size and weight of each device chip, which is to be incorporated into various electronic equipment or the like. For example, the wafer can be thinned by grinding in such a manner that the wafer is held on a chuck table in the condition where the front side of the wafer on which devices are formed is opposed to the upper surface of the chuck table and that a grinding wheel being rotated is brought into pressure contact with the back side of the wafer held on the chuck table.

In grinding the wafer by using such a method, a protective member is usually attached to the front side of the wafer (see Japanese Patent Laid-open No. Hei 10-50642, for example). Accordingly, it is possible to prevent that the devices formed on the front side of the wafer may be damaged by a grinding pressure applied to the wafer in the grinding operation. For example, the protective member is provided by an adhesive tape formed of resin or the like or by a rather hard substrate.

SUMMARY OF THE INVENTION

In many cases, unevenness such as bumps is formed on the front side of the wafer, wherein the bumps function as electrodes for each device. However, when such unevenness is present on the front side of the wafer, a level difference due to the unevenness cannot be sufficiently reduced by the adhesive tape, so that the shape corresponding to the unevenness appears on the back side of the wafer after grinding.

In the case of using a rather hard substrate as the protective member, such a problem hardly arises. However, this substrate is bonded to the wafer by using an adhesive such as a thermoplastic wax. Accordingly, in peeling the substrate from the wafer after grinding, it is necessary to perform an additional operation dedicated to the peeling of the substrate, such as immersion in a solution or heating.

It is therefore an object of the present invention to provide a wafer processing method which can sufficiently reduce the influence of the unevenness present on the front side of the wafer in grinding the back side of the wafer and can also eliminate the need for any additional operation after grinding the wafer.

In accordance with an aspect of the present invention, there is provided a wafer processing method including: a protective film providing step of providing a protective film on the front side of a wafer having a device area where a plurality of devices each having unevenness are formed and a peripheral marginal area surrounding the device area in the condition where the device area is covered with the protective film and the protective film is then brought into tight contact with the front side of the wafer so as to follow the shape of the unevenness; a wafer unit forming step of applying a liquid resin curable by an external stimulus to the front side of the wafer and then curing the liquid resin by applying the external stimulus to form a protective member covering the protective film and the peripheral marginal area of the wafer, thereby forming a wafer unit composed of the wafer, the protective film, and the protective member in the condition where the front side of the wafer is covered with the protective member; a grinding step of holding the protective member of the wafer unit on a holding surface of a chuck table and then grinding the back side of the wafer of the wafer unit to thereby reduce the thickness of the wafer; and a peeling step of peeling the protective member and the protective film from the wafer reduced in thickness.

Preferably, an edge portion between the outer circumference of the wafer and the front side of the wafer is chamfered, and the front side of the wafer is covered with the protective member so as to include the edge portion chamfered in the wafer unit forming step.

Preferably, the wafer unit forming step includes the steps of applying the liquid resin to a flat sheet, next pressing the wafer through the protective film against the liquid resin applied to the flat sheet, and next curing the liquid resin by applying the external stimulus to thereby fix the protective member to the wafer.

Preferably, the protective film providing step includes the steps of pressing the protective film against the front side of the wafer under a reduced pressure and next applying an atmospheric pressure to the protective film to thereby bring the protective film into tight contact with the front side of the wafer so as to follow the shape of the unevenness.

Preferably, the protective film providing step includes the step of applying a pressure through a cushion to the protective film to thereby press the protective film against the front side of the wafer.

Preferably, the protective film providing step includes the step of mounting a weight through a cushion on the protective film to thereby press the protective film against the front side of the wafer. More preferably, the protective film providing step includes the steps of mounting the weight through the cushion on the protective film under atmospheric pressure and next loading the wafer into a vacuum chamber in the condition where the weight is mounted on the wafer.

Preferably, the protective film providing step includes the steps of loading the wafer into a vacuum chamber in the condition where the device area is covered with the protective film and next using pressing means included in the vacuum chamber to press the protective film against the front side of the wafer.

In the wafer processing method according to the present invention, the device area where the devices each having unevenness are formed is first covered with the protective film, and the protective film is next brought into tight contact with the device area so as to follow the shape of the unevenness. Thereafter, the liquid resin curable by an external stimulus is applied to the front side of the wafer and then cured to form the protective member covering the protective film and the peripheral marginal area. Thus, the wafer unit composed of the wafer, the protective film, and the protective member is formed in the condition where the front side of the wafer is covered with the protective member through the protective film. Since the protective member has a suitable thickness, the influence of the unevenness formed on the front side of the wafer can be sufficiently reduced.

Further, in the wafer processing method according to the present invention, the protective film is not bonded to the device area, but merely kept in tight contact with the device area. Accordingly, it is unnecessary to perform a specific operation for peeling the protective film, such as immersion in a solution or heating. That is, the protective film and the protective member can be easily peeled from the wafer. As described above, in grinding the back side of the wafer, the influence of the unevenness present on the front side of the wafer can be sufficiently reduced. Furthermore, any additional operation is not required after grinding the wafer.

Further, in the wafer processing method according to the present invention, the protective film and the peripheral marginal area of the wafer are covered with the protective member formed from the liquid resin curable by an external stimulus. That is, the protective member is fixed to the peripheral marginal area of the wafer. Accordingly, although the protective film not having adhesion by an adhesive (gum) is used, there is no possibility that the protective film and the protective member may be peeled from the wafer in grinding the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the attached drawings. The wafer processing method according to this preferred embodiment includes a protective film providing step (see FIGS. 1A, 1B, 2A, 2B, and 2C), a wafer unit forming step (see FIGS. 3A, 3B, and 3C), a grinding step (see FIGS. 4A and 4B), and a peeling step (see FIG. 5). In the protective film providing step, a protective film not having adhesion by an adhesive (gum) is brought into tight contact with the front side of a wafer so that the protective film follows the shape of unevenness provided on the front side of the wafer. In the wafer unit forming step, the protective film is covered with a protective member formed from a liquid resin to thereby form a wafer unit composed of the wafer, the protective film, and the protective member. In the grinding step, the back side of the wafer is ground in the condition where the protective member of the wafer unit is held on a holding surface of a chuck table. In the peeling step, the protective member and the protective film are peeled from the wafer thinned by the grinding step. These steps of the wafer processing method according to this preferred embodiment will now be described in detail.

In the wafer processing method according to this preferred embodiment, the protective film providing step is first performed in such a manner that a protective film not having adhesion by an adhesive is brought into tight contact with the front side of a wafer so that the protective film follows the shape of unevenness provided on the front side of the wafer. More specifically, the front side of the wafer is first covered with a protective film having no adhesive layer, and the protective film is next brought into tight contact with the front side of the wafer.

Figure 1A:
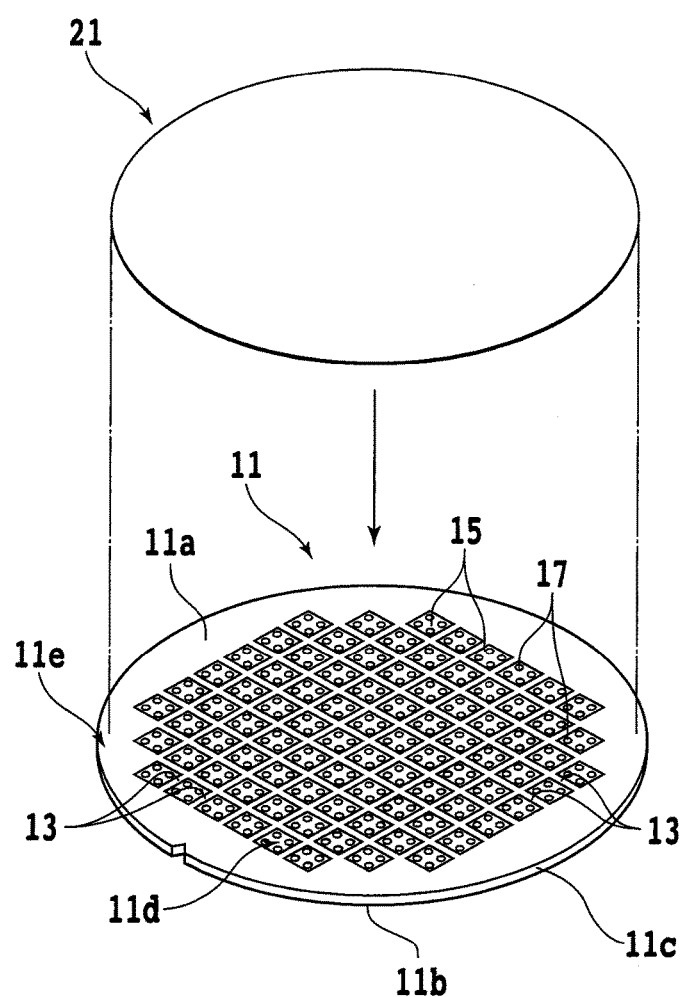
FIG. 1A is a schematic perspective view depicting a manner of covering the front side of a wafer with a protective film.
Figure 1B:
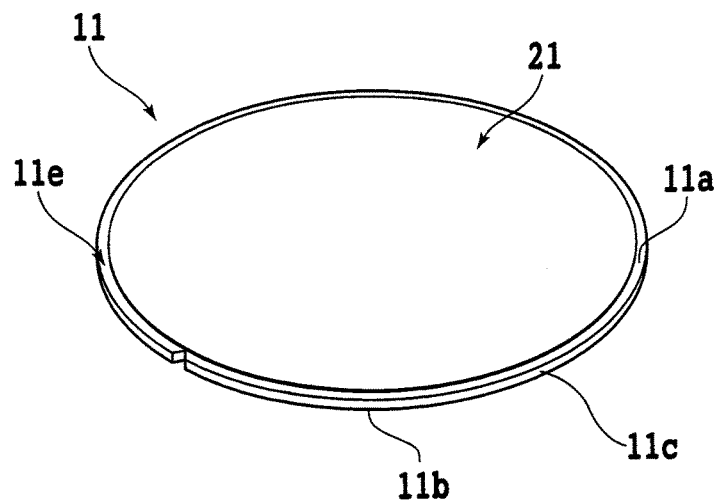
FIG. 1B is a schematic perspective view depicting the condition that the front side of the wafer is covered with the protective film.

FIG. 1A is a schematic perspective view depicting a manner of covering the front side of a wafer 11 with a protective film 21, and FIG. 1B is a schematic perspective view depicting the condition that the front side of the wafer 11 is covered with the protective film 21. As depicted in FIG. 1A, the wafer 11 is a disk-shaped member having a front side 11a and a back side 11b. For example, the wafer 11 is formed of silicon (Si). The wafer 11 has an outer circumference 11c, wherein the edge between the outer circumference 11c and the front side 11a is chamfered and the edge between the outer circumference 11c and the back side 11b is also chamfered. The front side 11a of the wafer 11 is composed of a central device area 11d and a peripheral marginal area 11e surrounding the device area 11d. The device area 11d is partitioned by a plurality of crossing division lines (streets) 13 to define a plurality of separate regions where a plurality of devices 15 such as integrated circuits (ICs) are formed. A plurality of bumps (unevenness) 17 functioning as electrodes are provided on the front side of each device 15. For example, each bump 17 is formed of solder. While the wafer 11 is a disk-shaped member formed of silicon in this preferred embodiment, the wafer 11 is not limited in material, shape, structure, size, and so on. For example, the wafer 11 may be formed of any other semiconductors, ceramic, resin, or metal. Similarly, the devices 15 and the bumps 17 are not limited in kind, quantity, shape, structure, size, arrangement, and so on. For example, the bumps 17 may be replaced by any structures (unevenness) having other functions. In other words, the bumps 17 may be omitted from the front side 11a of the wafer 11.

In the protective film providing step, the device area 11d of the wafer 11 is first covered with the protective film 21. The protective film 21 is a soft film formed of resin, for example. The protective film 21 is a circular member having a size (diameter) corresponding to the size of the device area 11d. That is, the diameter of the protective film 21 is smaller than the diameter of the wafer 11. The protective film 21 has no adhesive layer. Although not especially limited, the thickness of the protective film 21 is preferably set to approximately 30 to 150 μm, for example. As depicted in FIG. 1A, the protective film 21 is placed on the front side 11a of the wafer 11 in such a manner that the outer circumference of the protective film 21 coincides with the outer circumference of the device area 11d (the boundary between the device area 11d and the peripheral marginal area 11e), so that the device area 11d of the wafer 11 is fully covered with the protective film 21. In other words, the peripheral marginal area 11e of the wafer 11 is exposed as depicted in FIG. 1B.

Figure 2A:
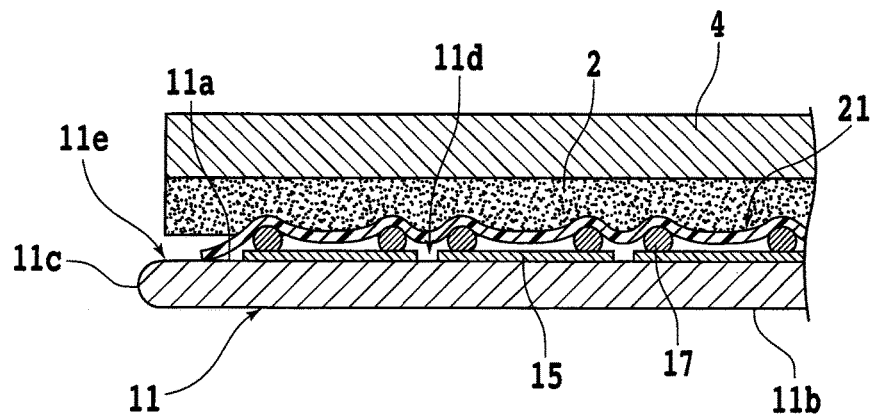
FIG. 2A is a schematic sectional view depicting a manner of pressing the protective film against the front side of the wafer.
Figure 2B:
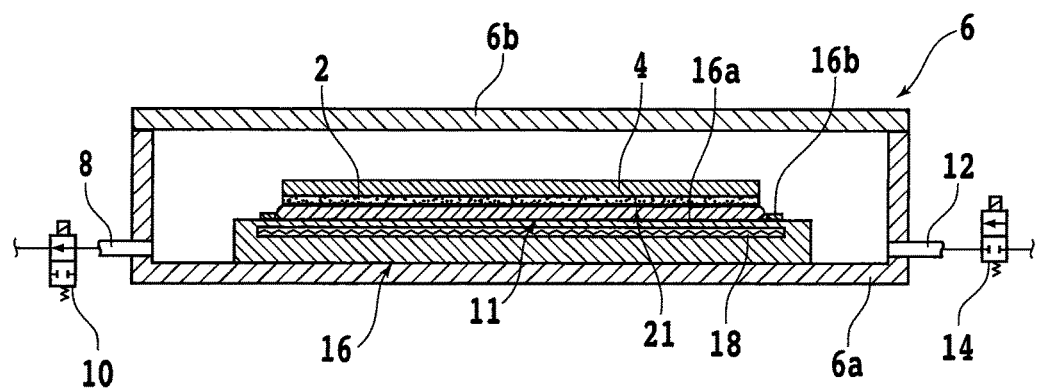
FIG. 2B is a schematic sectional view depicting a manner of bringing the protective film into tight contact with the front side of the wafer.
Figure 2C:
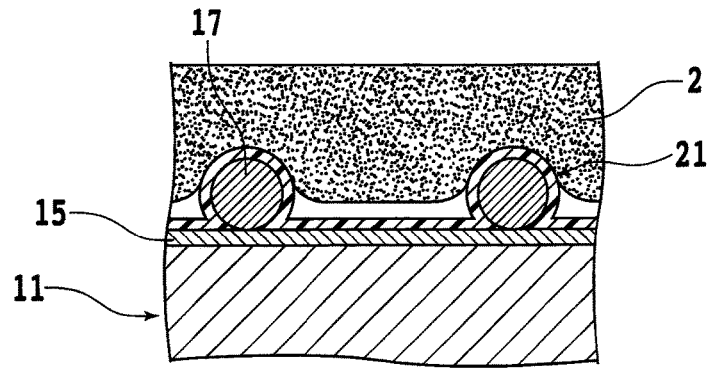
FIG. 2C is a schematic sectional view depicting the condition that the protective film is in tight contact with the front side of the wafer.

After covering the front side 11a (strictly, the device area 11d) of the wafer 11 with the protective film 21, the protective film 21 is brought into tight contact with the front side 11a of the wafer 11 in the following manner. FIG. 2A is a schematic sectional view depicting a manner of pressing the protective film 21 against the front side 11a of the wafer 11. FIG. 2B is a schematic sectional view depicting a manner of bringing the protective film 21 into tight contact with the front side 11a of the wafer 11. FIG. 2C is a schematic sectional view depicting the condition that the protective film 21 is in tight contact with the front side 11a of the wafer 11. More specifically, as depicted in FIG. 2A, a weight 4 is mounted through a cushion 2 such as a sponge on the front side 11a of the wafer 11 (strictly, on the protective film 21 covering the front side 11a) under atmospheric pressure, thereby pressing the protective film 21 against the front side 11a of the wafer 11. In other words, a pressure is applied through the cushion 2 to the protective film 21, thereby pressing the protective film 21 against the front side 11a of the wafer 11. As a result, a part of the protective film 21 is brought into contact with the front side 11a of the wafer 11.

Thereafter, the wafer 11 is loaded into a vacuum chamber 6 in the condition where the weight 4 is mounted on the wafer 11 as depicted in FIG. 2B. The vacuum chamber 6 includes a casing 6a having an upper opening of the size allowing the pass of the wafer 11 and a door 6b for closing the upper opening of the casing 6a. The casing 6a is connected through an air outlet pipe 8 and a valve 10 to a vacuum source (not depicted), wherein the air in the vacuum chamber 6 is removed through the air outlet pipe 8. Further, an air inlet pipe 12 and a valve 14 are connected to the casing 6a, wherein the outside air (atmosphere) is sucked through the air inlet pipe 12 into the vacuum chamber 6. A support table 16 for supporting the wafer 11 is provided in the casing 6a. The support table 16 has a substantially flat upper surface functioning as a support surface 16a for supporting the wafer 11 thereon. The support surface 16a is provided with a projecting guide portion 16b for positioning the wafer 11. A heater 18 for heating the protective film 21 is built in the support table 16. In operation, the door 6b is first opened to load the wafer 11 through the upper opening of the casing 6a into the vacuum chamber 6 in the condition where the weight 4 is mounted through the cushion 2 on the front side 11a of the wafer 11 covered with the protective film 21. After the wafer 11 is supported on the support surface 16a of the support table 16 so as to be positioned by the guide portion 16b, the door 6b is closed as depicted in FIG. 2B and the valve 14 is next closed. Further, the valve 10 is opened to thereby evacuate the inside space of the vacuum chamber 6. As a result, the protective film 21 is pressed on the front side 11a of the wafer 11 by the weight 4 under a reduced pressure. Further, the gas (air) remaining between the front side 11a of the wafer 11 and the protective film 21 is removed.

After the inside space of the vacuum chamber 6 is sufficiently evacuated, the valve 10 is closed and the valve 14 is next opened to introduce the outside air (atmosphere) into the inside space of the vacuum chamber 6. As a result, an atmospheric pressure is applied to the protective film 21, so that the protective film 21 can be brought into tight contact with the front side 11a of the wafer 11 so as to follow the shape of the bumps 17 provided on the front side 11a of the wafer 11 as depicted in FIG. 2C. In applying the atmospheric pressure to the protective film 21, the heater 18 may be operated to heat the protective film 21 and thereby soften the same. In this case, the protective film 21 can be brought into tight contact with the wafer 11 more easily.

Figure 3A:
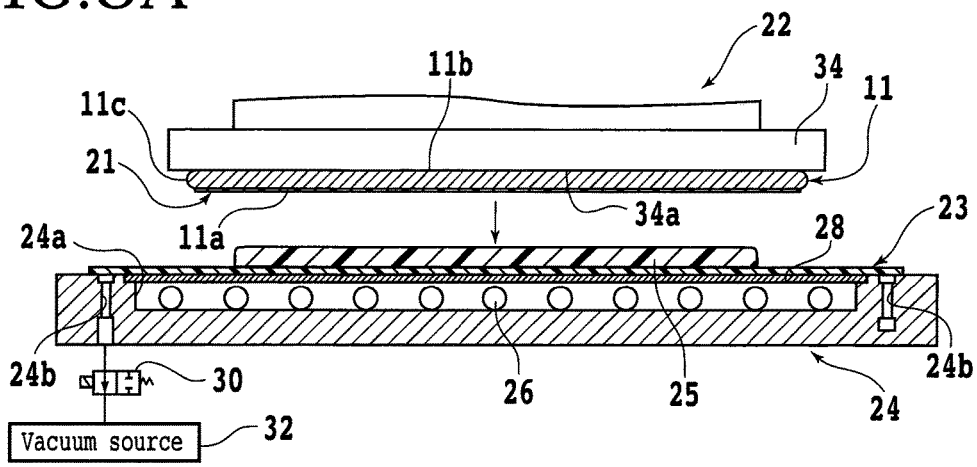
FIG. 3A is a schematic sectional view depicting a manner of pressing the wafer through the protective film against a liquid resin previously applied to a sheet.
Figure 3B:
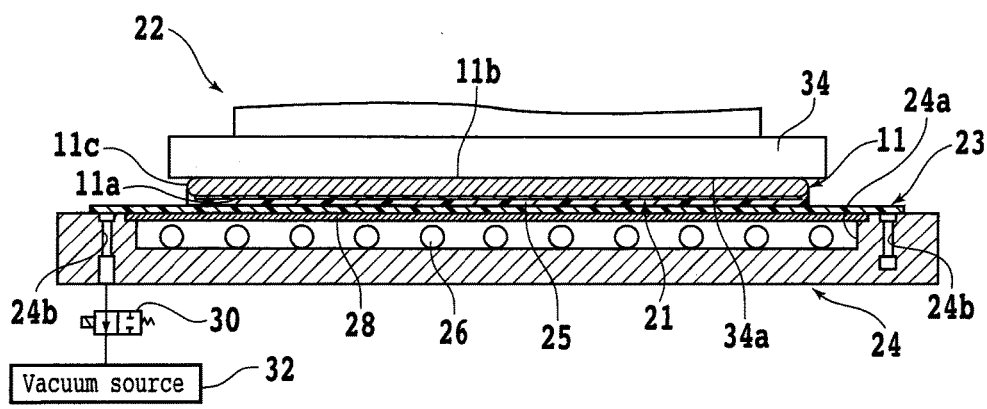
FIG. 3B is a schematic sectional view depicting a manner of curing the liquid resin to form a protective member, thereby fixing the protective member to the wafer.
Figure 3C:
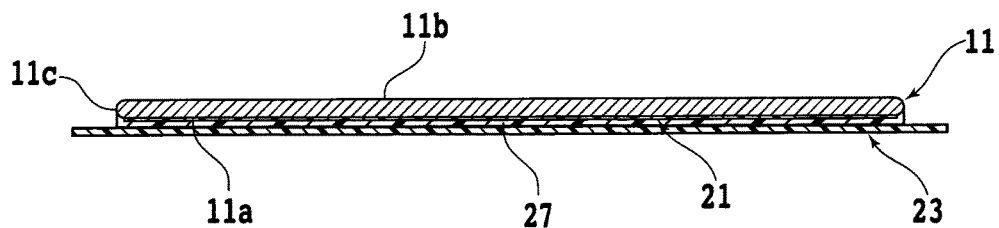
FIG. 3C is a schematic sectional view of a wafer unit formed by fixing the protective member to the wafer.

After performing the protective film providing step, the wafer unit forming step is performed in such a manner that the protective film 21 is covered with a protective member formed from a liquid resin to thereby form a wafer unit composed of the wafer 11, the protective film 21, and the protective member, wherein the front side 11a of the wafer 11 is covered with the protective member. FIG. 3A is a schematic sectional view depicting a manner of pressing the wafer 11 through the protective film 21 against a liquid resin previously applied to a sheet. FIG. 3B is a schematic sectional view depicting a manner of curing the liquid resin to form a protective member, thereby fixing the protective member to the wafer 11. FIG. 3C is a schematic sectional view of a wafer unit formed by fixing the protective member to the wafer 11. In FIGS. 3A and 3B, a part of the components is depicted by a functional block.

The wafer unit forming step is performed by using a protective member fixing apparatus 22 depicted in FIGS. 3A and 3B. The protective member fixing apparatus 22 includes a holding table 24 for holding a substantially flat sheet (carrier sheet) 23 formed of resin, for example. The upper surface of the holding table 24 is formed with a circular recess 24a having a diameter larger than that of the wafer 11. An ultraviolet light source 26 is provided inside the recess 24a. The upper end of the recess 24a is covered with a plate 28 capable of transmitting at least a part of ultraviolet light emitted from the ultraviolet light source 26. A central part of the sheet 23 is adapted to be supported by the plate 28. A suction passage 24b for sucking a peripheral portion of the sheet 23 is formed in the holding table 24. One end of the suction passage 24b opens to the upper surface around the recess 24a of the holding table 24, and the other end of the suction passage 24b is connected through a valve 30 to a vacuum source 32. By applying a vacuum from the vacuum source 32 through the suction passage 24b to the peripheral portion of the sheet 23, the sheet 23 is held on the holding table 24 under suction. A wafer holding unit 34 for holding the wafer 11 under suction is provided above the holding table 24. The wafer holding unit 34 is supported by a moving mechanism (not depicted). The wafer 11 is adapted to be held on a lower surface 34a of the wafer holding unit 34 under suction. The wafer 11 held by the wafer holding unit 34 is vertically movable by operating the moving mechanism.

In the wafer unit forming step, a liquid resin 25 is previously applied to the upper surface of the sheet 23, and the lower surface of the sheet 23 is held on the holding table 24 as depicted in FIG. 3A. On the other hand, the back side 11b of the wafer 11 is held on the lower surface 34a of the wafer holding unit 34 as depicted in FIG. 3A. Accordingly, the protective film 21 kept in tight contact with the front side 11a of the wafer 11 is opposed to the liquid resin 25 applied to the sheet 23. In this preferred embodiment, the liquid resin 25 is an ultraviolet curable liquid resin capable of being cured by the ultraviolet light emitted from the ultraviolet light source 26. For example, TEMPLOC (registered trademark) manufactured by Denka Company Limited may be used as the liquid resin 25. While the liquid resin 25 is previously applied to the upper surface of the sheet 23 and the sheet 23 is next held on the holding table 24 in this preferred embodiment, the sheet 23 may be first held on the holding table 24 and the liquid resin 25 may be next applied to the sheet 23.

Thereafter, the wafer holding unit 34 is lowered to press the front side 11a of the wafer 11 through the protective film 21 against the liquid resin 25 as depicted in FIG. 3B. Accordingly, the liquid resin 25 is spread in the radial direction of the wafer 11 and covers the protective film 21 and the peripheral marginal area 11e. In this preferred embodiment, the amount of the liquid resin 25 to be applied to the sheet 23 and the amount of lowering of the wafer holding unit 34 are adjusted so that the liquid resin 25 covers the chamfered edge between the outer circumference 11c and the front side 11a of the wafer 11. Thereafter, ultraviolet light is emitted from the ultraviolet light source 26 to thereby cure the liquid resin 25. As a result, the liquid resin 25 is formed into a protective member 27 covering the protective film 21 and the peripheral marginal area 11e as depicted in FIG. 3C. The protective member 27 is fixed to the front side 11a of the wafer 11, thereby forming a wafer unit composed of the wafer 11, the protective film 21, and the protective member 27, wherein the front side 11a of the wafer 11 is covered with the protective member 27 supported to the sheet 23. Note that the chamfered edge between the outer circumference 11c and the front side 11a of the wafer 11 is also covered by the protective member 27 in this preferred embodiment.

Figure 4A:
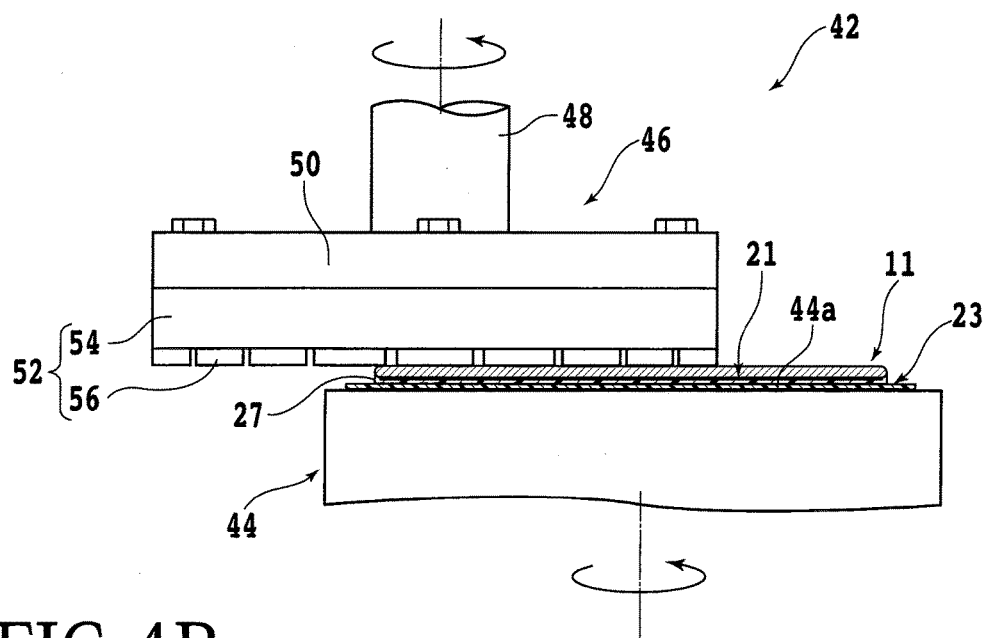
FIG. 4A is a schematic sectional view depicting a manner of grinding the back side of the wafer.
Figure 4B:
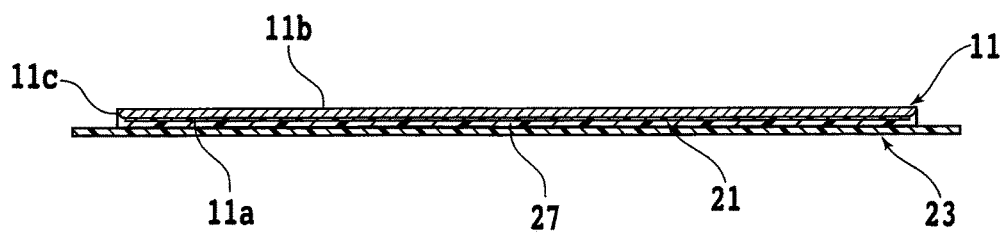
FIG. 4B is a schematic sectional view depicting the condition that the back side of the wafer has been ground.

After performing the wafer unit forming step, the grinding step is performed to grind the back side 11b of the wafer 11. FIG. 4A is a schematic sectional view depicting a manner of grinding the back side 11b of the wafer 11, and FIG. 4B is a schematic sectional view depicting the condition that the back side 11b of the wafer 11 has been ground. The grinding step is performed by using a grinding apparatus 42 depicted in FIG. 4A. The grinding apparatus 42 includes a holding table (chuck table) 44 for holding the wafer 11 (wafer unit) under suction. The holding table 44 is connected to a rotational drive source (not depicted) such as a motor and adapted to be rotated about an axis substantially parallel to a vertical direction. A moving mechanism (not depicted) is provided below the holding table 44 and the holding table 44 is horizontally movable by this moving mechanism. A part of the upper surface of the holding table 44 is formed as a holding surface 44a for holding the sheet 23 fixed through the protective member 27 to the wafer 11 under suction. The holding surface 44a is connected through a suction passage (not depicted) to a vacuum source (not depicted). The suction passage is formed in the holding table 44. By applying a vacuum from the vacuum source to the holding surface 44a, the wafer 11 is held through the sheet 23 and the protective member 27 on the holding table 44 under suction.

The grinding apparatus 42 further includes a grinding unit 46 provided above the holding table 44. The grinding unit 46 includes a spindle housing (not depicted) supported by an elevating mechanism (not depicted). A spindle 48 is rotatably supported in the spindle housing. A disk-shaped mount 50 is fixed to the lower end of the spindle 48. A grinding wheel 52 having substantially the same diameter as that of the mount 50 is mounted on the lower surface of the mount 50. The grinding wheel 52 includes a wheel base 54 formed of metal such as stainless steel or aluminum. A plurality of abrasive members 56 are fixed to the lower surface of the wheel base 54 so as to be arranged annularly. A rotational drive source (not depicted) such as a motor is connected to the upper end (base end) of the spindle 48, so that the grinding wheel 52 is rotated about an axis substantially parallel to a vertical direction by a force produced by the rotational drive source. A nozzle (not depicted) for supplying a grinding fluid such as pure water to the wafer 11 is provided inside or near the grinding unit 46.

In the grinding step, the wafer 11 (wafer unit) is first held on the holding table 44 of the grinding apparatus 42 under suction. More specifically, the sheet 23 fixed through the protective member 27 to the wafer 11 is brought into contact with the holding surface 44a of the holding table 44, and a vacuum from the vacuum source is applied to the holding surface 44a. Accordingly, the wafer 11 is held on the holding table 44 under suction in the condition where the back side 11b of the wafer 11 is exposed upward. Thereafter, the holding table 44 is moved to a position below the grinding unit 46. Thereafter, both the holding table 44 and the grinding wheel 52 are rotated as depicted in FIG. 4A, and the spindle housing (the spindle 48 and the grinding wheel 52) is lowered as supplying a grinding fluid to the back side 11b of the wafer 11. A lowering speed (feed amount) of the spindle housing is adjusted so that the lower surface of each abrasive member 56 abuts against the back side 11b of the wafer 11. As a result, the back side 11b of the wafer 11 can be ground to reduce the thickness of the wafer 11. When the thickness of the wafer 11 is reduced to a predetermined thickness (finished thickness) as depicted in FIG. 4B, the grinding step is finished.

While the back side 11b of the wafer 11 is ground by using the single grinding unit 46 in this preferred embodiment, two or more grinding units may be used to grind the wafer 11. In this case, coarse grinding may be first performed by using abrasive members each having large-sized abrasive grains, and finish grinding may be next performed by using abrasive members each having small-sized abrasive grains. According to this grinding, the flatness of the back side 11b can be improved without largely increasing the time required for grinding.

Figure 5:
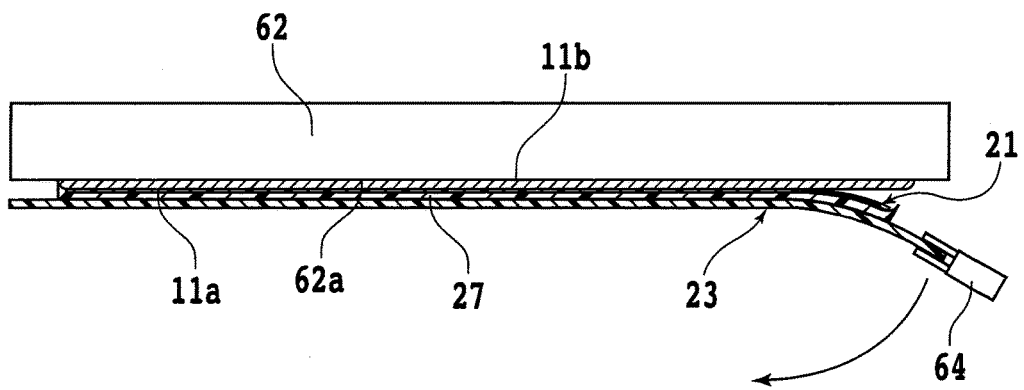
FIG. 5 is a schematic sectional view depicting a manner of peeling the protective film, the protective member, and the sheet from the wafer.

After performing the grinding step, the peeling step is performed to peel the protective film 21, the protective member 27, and the sheet 23 from the wafer 11 reduced in thickness. FIG. 5 is a schematic sectional view depicting a manner of peeling the protective film 21, the protective member 27, and the sheet 23 from the wafer 11. In the peeling step, a wafer holding unit 62 having a holding surface 62a for holding the wafer 11 (wafer unit fixed to the sheet 23) under suction is first prepared, and the back side 11b of the wafer 11 is held on the holding surface 62a of the wafer holding unit 62 under suction. Thereafter, a peeling unit 64 is used to grip an end portion of the sheet 23. Thereafter, the wafer holding unit 62 and the peeling unit 64 are relatively moved to separate the sheet 23 away from the wafer 11. Accordingly, the protective film 21, the protective member 27, and the sheet 23 can be peeled as a unit from the wafer 11 as depicted in FIG. 5.

In the wafer processing method according to this preferred embodiment, the device area 11d where the devices 15 each having the bumps (unevenness) 17 are formed is first covered with the protective film 21, and the protective film 21 is next brought into tight contact with the device area 11d so as to follow the shape of the bumps 17. Thereafter, the liquid resin 25 curable by ultraviolet light (external stimulus) is applied to the front side 11a of the wafer 11 and then cured to form the protective member 27 covering the protective film 21 and the peripheral marginal area lie. Thus, the wafer unit composed of the wafer 11, the protective film 21, and the protective member 27 is formed in the condition where the front side 11a of the wafer 11 is covered with the protective member 27 through the protective film 21. Since the protective member 27 has a suitable thickness, the influence of the unevenness formed on the front side 11a of the wafer 11 can be sufficiently reduced. Further, in the wafer processing method according to this preferred embodiment, the protective film 21 is not bonded to the device area 11d, but merely kept in tight contact with the device area 11d. Accordingly, it is unnecessary to perform a specific operation for peeling the protective film 21, such as immersion in a solution or heating. That is, the protective film 21 and the protective member 27 can be easily peeled from the wafer 11. As described above, in grinding the back side 11b of the wafer 11, the influence of the unevenness such as the bumps 17 present on the front side 11a of the wafer 11 can be sufficiently reduced. Furthermore, any additional operation is not required after grinding the wafer 11. Further, in the wafer processing method according to this preferred embodiment, the protective film 21 and the peripheral marginal area 11e of the wafer 11 are covered with the protective member 27 formed from the liquid resin 25 curable by ultraviolet light. That is, the protective member 27 is fixed to the peripheral marginal area 11e of the wafer 11. Accordingly, although the protective film 21 not having adhesion by an adhesive (gum) is used, there is no possibility that the protective film 21 and the protective member 27 may be peeled from the wafer 11 in grinding the wafer 11.

The present invention is not limited to the above preferred embodiment, but various modifications may be made. For example, while the liquid resin 25 is a liquid resin curable by ultraviolet light in the above preferred embodiment, any other types of liquid resin curable by any external stimulus (e.g., heat) other than ultraviolet light may be used in the present invention.

In this preferred embodiment, the protective member 27 is fixed to the wafer 11 by pressing the wafer 11 through the protective film 21 against the liquid resin 25 applied to the sheet 23. As a modification, the liquid resin 25 may be dropped onto the wafer 11 and the protective film 21 to thereby fix the protective member 27 to the wafer 11. In this case, the front side (exposed surface) of the protective member 27 is preferably flattened (planarized) by using a surface planer or the like. By flattening the front side of the protective member 27 fixed to the wafer 11, the back side 11b (work surface) of the wafer 11 can be flattened by grinding.

In the above preferred embodiment, the weight 4 is mounted through the cushion 2 on the front side 11a of the wafer 11 (strictly, on the protective film 21 covering the front side 11a) to thereby press the protective film 21 against the front side 11a of the wafer 11. Thereafter, the protective film 21 is brought into tight contact with the front side 11a of the wafer 11. However, any other methods may be adopted as this protective film providing step.

Figure 6A:
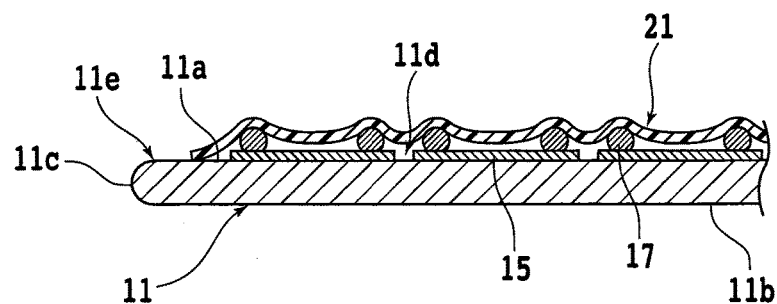
FIGS. 6A, 6B, and 6C are schematic sectional views depicting a first modification of the protective film providing step.
Figure 6B:
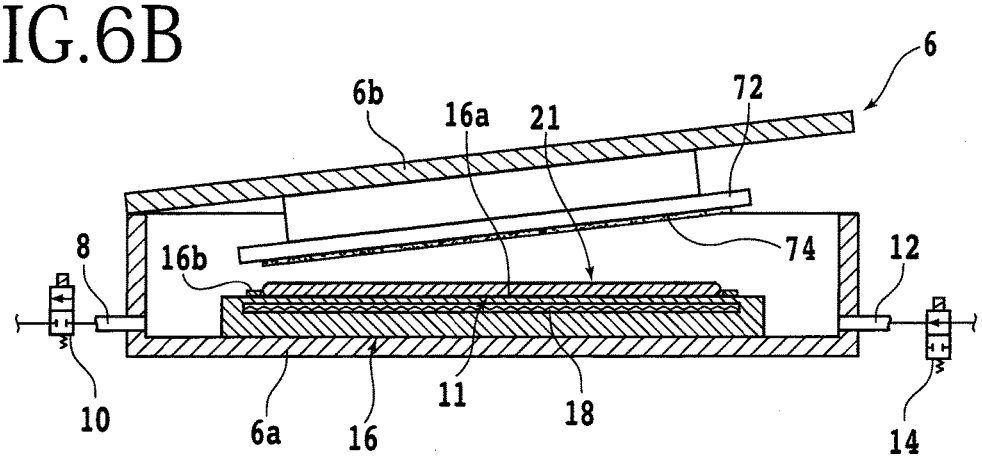
Figure 6C:
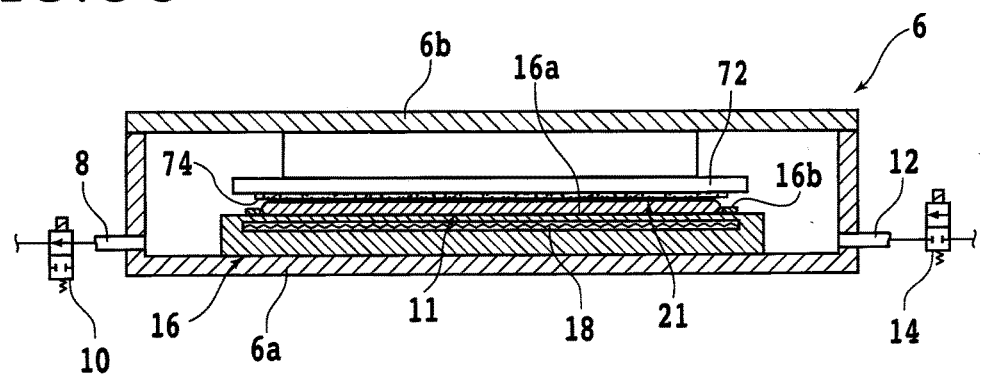

FIGS. 6A, 6B, and 6C depict a first modification of the protective film providing step, wherein FIG. 6A is a schematic sectional view depicting a condition that the front side 11a of the wafer 11 is covered with the protective film 21, and FIGS. 6B and 6C are schematic sectional views depicting a manner of bringing the protective film 21 into tight contact with the front side 11a of the wafer 11. In the protective film providing step according to the first modification, the protective film 21 is placed on the front side 11a of the wafer 11 (strictly, on the device area 11d) as depicted in FIG. 6A in a manner similar to that of the above preferred embodiment. Thus, the front side 11a of the wafer 11 is covered with the protective film 21. Thereafter, the wafer 11 is loaded into a vacuum chamber 6 as depicted in FIG. 6B.

The vacuum chamber 6 to be used in the first modification is basically the same in configuration as that in the above preferred embodiment as depicted in FIG. 6B. However, the vacuum chamber 6 to be used in the first modification includes a pressing unit (pressing means) 72 for pressing the protective film 21 against the wafer 11. The pressing unit 72 is provided on the inside wall surface of the door 6b. The pressing unit 72 has a surface as a pressing surface opposed to the support table 16, and a cushion 74 such as a sponge is provided on the lower surface of the pressing unit 72. Accordingly, when the door 6b is closed in the condition where the wafer 11 is placed on the support table 16 of the vacuum chamber 6, the protective film 21 covering the front side 11a of the wafer 11 is pressed through the cushion 74 against the wafer 11 by the pressing unit 72 as depicted in FIGS. 6B and 6C. Thus, the protective film 21 is pressed against the front side 11a of the wafer 11. As a result, a part of the protective film 21 is brought into contact with the front side 11a of the wafer 11.

Thereafter, the valve 14 is closed and the valve 10 is next opened to thereby evacuate the inside space of the vacuum chamber 6. Accordingly, the protective film 21 is pressed against the front side 11a of the wafer 11 by the pressing unit 72 under a reduced pressure as depicted in FIG. 6C. Further, the gas (air) remaining between the front side 11a of the wafer 11 and the protective film 21 is removed. After the inside space of the vacuum chamber 6 is sufficiently evacuated, the valve 10 is closed and the valve 14 is next opened to introduce the outside air (atmosphere) into the inside space of the vacuum chamber 6. As a result, an atmospheric pressure is applied to the protective film 21, so that the protective film 21 can be brought into tight contact with the front side 11a of the wafer 11 so as to follow the shape of the bumps 17 provided on the front side 11a of the wafer 11.

Figure 7A:
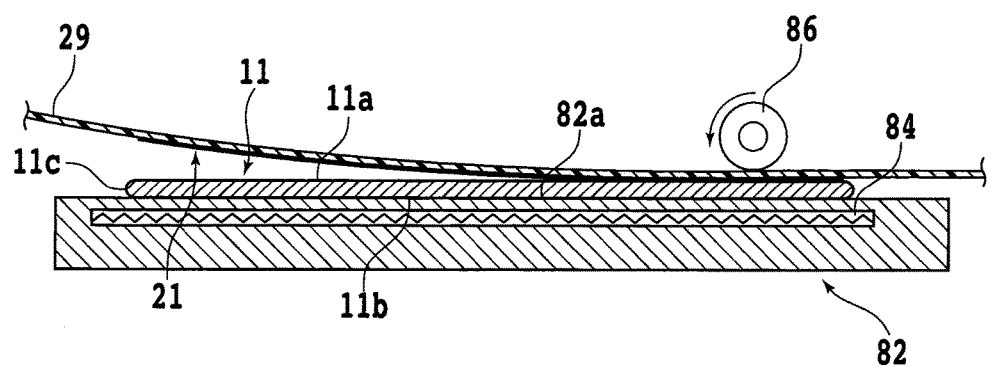
FIGS. 7A and 7B are schematic sectional views depicting a second modification of the protective film providing step.
Figure 7B:
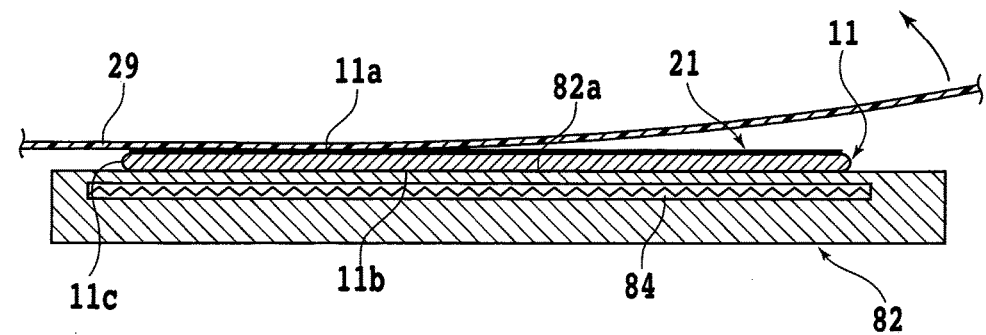

FIGS. 7A and 7B are schematic sectional views depicting a second modification of the protective film providing step. In the protective film providing step according to the second modification, a holding table 82 having an upper surface as a holding surface 82a is prepared, and the back side 11b of the wafer 11 is held on the holding surface 82a of the holding table 82 in the condition where the protective film 21 is not mounted on the front side 11a of the wafer 11. The configuration of the holding table 82 is basically the same as that of the holding table 44. A heater 84 is built in the holding table 82. The protective film 21 is previously held on the lower surface of a sheet (releasing sheet) 29. Thereafter, the protective film 21 held by the sheet 29 is opposed to the front side 11a (the device area 11d) of the wafer 11, and a roller 86 is used to rollingly press the upper surface of the sheet 29 as depicted in FIG. 7A. At this time, the heater 84 may be operated to heat the protective film 21 and thereby soften the same. Accordingly, the protective film 21 is mounted to the front side 11a of the wafer 11 so as to cover the device area 11d. Thus, the front side 11a of the wafer 11 (strictly, the device area 11d) can be covered with the protective film 21. Thereafter, the sheet 29 is removed from the protective film 21 as depicted in FIG. 7B. This covering operation using the roller 86 may be performed in the vacuum chamber 6. After covering the front side 11a (the device area 11d) of the wafer 11 with the protective film 21, the protective film 21 is brought into tight contact with the front side 11a of the wafer 11 in a manner similar to that of the above preferred embodiment or the first modification.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method comprising:
a protective film providing step of providing a protective film on a front side of a wafer having a device area where a plurality of devices each having unevenness are formed and a peripheral marginal area surrounding said device area in the condition where said device area is covered with said protective film and said protective film is then brought into tight contact with the front side of said wafer so as to follow the shape of said unevenness;
a wafer unit forming step of applying a liquid resin curable by an external stimulus to the front side of said wafer and then curing said liquid resin by applying said external stimulus to form a protective member covering said protective film and said peripheral marginal area of said wafer, thereby forming a wafer unit composed of said wafer, said protective film, and said protective member in the condition where the front side of said wafer is covered with said protective member;
a grinding step of holding said protective member of said wafer unit on a holding surface of a chuck table and then grinding a back side of said wafer of said wafer unit to thereby reduce a thickness of said wafer; and
a peeling step of peeling said protective member and said protective film from said wafer reduced in thickness.

2. The wafer processing method according to claim 1, wherein an edge portion between an outer circumference of said wafer and the front side of said wafer is chamfered; and
the front side of said wafer is covered with said protective member so as to include said edge portion chamfered in said wafer unit forming step.

3. The wafer processing method according to claim 1, wherein said wafer unit forming step includes the steps of applying said liquid resin to a flat sheet, next pressing said wafer through said protective film against said liquid resin applied to said flat sheet, and next curing said liquid resin by applying said external stimulus to thereby fix said protective member to said wafer.

4. The wafer processing method according to claim 1, wherein said protective film providing step includes the steps of pressing said protective film against the front side of said wafer under a reduced pressure and next applying an atmospheric pressure to said protective film to thereby bring said protective film into tight contact with the front side of said wafer so as to follow the shape of said unevenness.

5. The wafer processing method according to claim 1, wherein said protective film providing step includes the step of applying a pressure through a cushion to said protective film to thereby press said protective film against the front side of said wafer.

6. The wafer processing method according to claim 1, wherein said protective film providing step includes the step of mounting a weight through a cushion on said protective film to thereby press said protective film against the front side of said wafer.

7. The wafer processing method according to claim 6, wherein said protective film providing step includes the steps of mounting said weight through said cushion on said protective film under atmospheric pressure and next loading said wafer into a vacuum chamber in the condition where said weight is mounted on said wafer.

8. The wafer processing method according to claim 1, wherein said protective film providing step includes the steps of loading said wafer into a vacuum chamber in the condition where said device area is covered with said protective film and next using pressing means included in said vacuum chamber to press said protective film against the front side of said wafer.

* * * * *